(12) United States Patent
Jang

(10) Patent No.: US 7,615,991 B2
(45) Date of Patent: Nov. 10, 2009

(54) METHOD FOR MEASURING ANALOG CHANNEL RESISTANCE OF A SEMICONDUCTOR DEVICE HAVING A GATE, A SOURCE, A DRAIN, A DRAIN SENSE AND A SOURCE SENSE

(75) Inventor: Chang Soo Jang, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 183 days.

(21) Appl. No.: 11/892,753

(22) Filed: Aug. 27, 2007

(65) Prior Publication Data
US 2008/0054915 A1    Mar. 6, 2008

(30) Foreign Application Priority Data
Aug. 29, 2006   (KR) ...................... 10-2006-0082395

(51) Int. Cl.
*G01R 27/08*   (2006.01)
*G01R 27/14*   (2006.01)

(52) U.S. Cl. .................................................. 324/158.1
(58) Field of Classification Search ....................... None
See application file for complete search history.

(56) References Cited

U.S. PATENT DOCUMENTS 4,996,570 A * 2/1991 Van Houten et al. ........ 257/194
5,130,765 A * 7/1992 Van Houten et al. ........ 257/192

* cited by examiner

*Primary Examiner*—Paresh Patel
(74) *Attorney, Agent, or Firm*—Finnegan, Henderson, Farabow, Garrett and Dunner, L.L.P.

(57) ABSTRACT

A semiconductor device and a method for measuring an analog channel resistance thereof are provided. The semiconductor device includes a substrate, a gate insulating layer and a gate formed on the substrate, a source and a drain formed in the substrate and at both sides of the gate, a source sense connected to the source, and a drain sense connected to the drain.

4 Claims, 3 Drawing Sheets

METHOD FOR MEASURING ANALOG CHANNEL RESISTANCE OF A SEMICONDUCTOR DEVICE HAVING A GATE, A SOURCE, A DRAIN, A DRAIN SENSE AND A SOURCE SENSE

CROSS-REFERENCE TO RELATED APPLICATIONS

The present application claims the benefit of priority under 35 U.S.C. §119 to Korean Patent Application No. 10-2006-0082395, filed Aug. 29, 2006, the entire contents of which are incorporated herein by reference.

BACKGROUND

The present invention relates to a semiconductor device and a method for measuring an analog channel resistance of a semiconductor device.

In general, an analog channel resistance is measured in a typical MOS (Metal-Oxide-Semiconductor) transistor structure by respectively applying voltages to a gate, a drain, a source, and a substrate (bulk) using a source monitoring unit (SMU) of a semiconductor parameter analyzer. Then, a current is measured at a port of the semiconductor parameter analyzer, which applies a voltage, thereby allowing calculation of a ratio of the applied voltage and the measured current.

The analog channel resistance measured by the SMU may contain an external resistance of the semiconductor device, which may cause an error in the measured analog channel resistance. That is, the ohmic resistance caused by interconnecting a metal line to another metal line through a via or a contact, and electrically connecting a MOS transistor to the semiconductor parameter analyzer, may be much higher than the analog channel resistance of the MOS transistor. As a result, it may be difficult to accurately measure the analog channel resistance of the MOS transistor.

SUMMARY

Embodiments consistent with the present invention provide a semiconductor device and a method for measuring an analog channel resistance of the semiconductor device. The method can accurately extract actual device characteristics by minimizing an external resistance at a measuring point.

Embodiments consistent with the present invention also provide a method for measuring an analog channel resistance, the method being applicable to a program in an automated measuring apparatus.

In one embodiment, there is provided a semiconductor device including a substrate; a gate insulating layer and a gate formed on the substrate; a source and a drain formed on the substrate at both sides of the gate; a source sense connected to the source; and a drain sense connected to the drain.

In another embodiment, there is provided a method for measuring an analog channel resistance of a semiconductor device having a gate, a source, a source sense coupled to the source, a drain, and a drain sense coupled to the drain, the method comprising: setting a measuring condition including bias voltages; measuring a first drain current by applying a first voltage to the drain after applying the bias voltages of the measuring condition; measuring a first voltage difference of the drain sense and the source sense under the condition that currents of the source sense and the drain sense are constrained to zero Ampere; measuring a second drain current by applying a second voltage to the drain after applying the bias voltages of the measuring condition; measuring a second voltage difference of the drain sense and the source sense under the condition that currents of the source sense and the drain sense are constrained to zero Ampere; and measuring the analog channel resistance by calculating a ratio of a voltage drop between the first and second voltage difference, and a current difference between the first and second drain currents.

In a further embodiment, there is provided a method for measuring an analog channel resistance of a semiconductor device, the method comprising: setting a predetermined measuring condition; applying a first drain voltage (Vd1) to a drain of the semiconductor device; measuring a first drain current (Id1) after applying the measuring condition; measuring a first drain sense voltage (Vdm1) of a drain sense coupled to the drain under the condition that a current of the drain sense is constrained to zero Ampere; measuring a first source sense voltage (Vsm1) of a source sense coupled to a source of the semiconductor device under the condition that a current of the source sense is constrained to zero Ampere; applying a second drain voltage (Vd2) to the drain, the second drain voltage (Vd2) being different from the first drain voltage (Vd1); measuring a drain current (Id2) after applying the measuring condition; measuring a second drain sense voltage (Vdm2) of the drain sense under the condition that a current of the drain sense is constrained to zero Ampere; measuring a second source sense voltage (Vsm2) of the source sense under the condition that a current of the source sense is constrained to zero Ampere; and measuring an analog channel resistance (Rch) using the measured values of Vdm1, Vsm1, Vdm2, Vsm2, Id1, and Id2.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor device and a method for measuring an analog channel resistance of the semiconductor device will be described with reference to the accompanying drawings.

In the following description, it will be understood that when a layer (or film) is referred to as being 'on' another layer or substrate, it may mean that a layer is directly formed on another layer or substrate, or one or more intervening layers may be present. Further, it will be understood that when a layer is referred to as being 'under' another layer, it may mean that a layer is directly formed under another layer, or one or more intervening layers may be present. In addition, it will also be understood that when a layer is referred to as being 'between' two other layers, it may mean that the layer is the only layer formed between the two other layers, or one or more intervening layers may be present.

Figure 1:
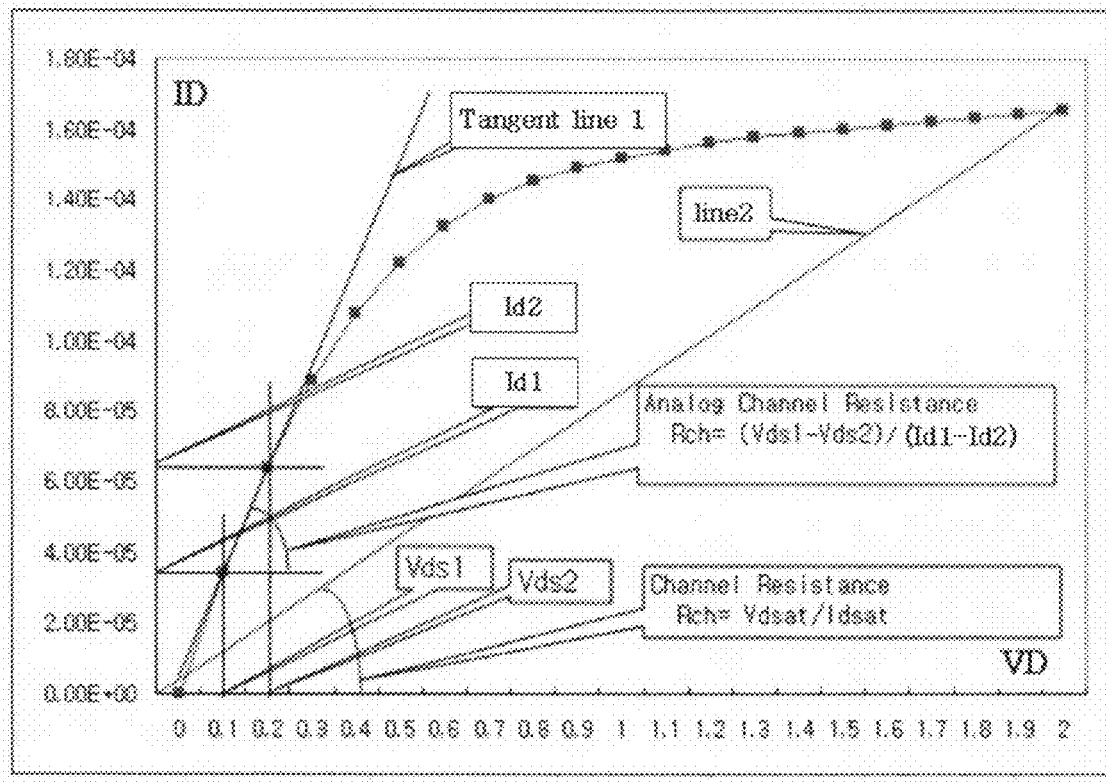
FIG. 1 is a graph illustrating a channel resistance and an analog channel resistance of a semiconductor device.

FIG. 1 is a graph illustrating a channel resistance and an analog channel resistance of a transistor according to an embodiment. The channel resistance may be defined as a resistance between a drain and a source when the MOS transistor operates in a saturation region. Unlike the channel resistance, the analog channel resistance is defined as a resistance obtained by differentiating a voltage variation between the drain and the source over a current variation, when the MOS transistor operates in a linear region. In the graph of FIG. 1, a reciprocal of a slope of a tangent line 1 denotes an analog channel resistance, and a reciprocal of a slope of a line 2 denotes a channel resistance.

First Embodiment

Figure 2:
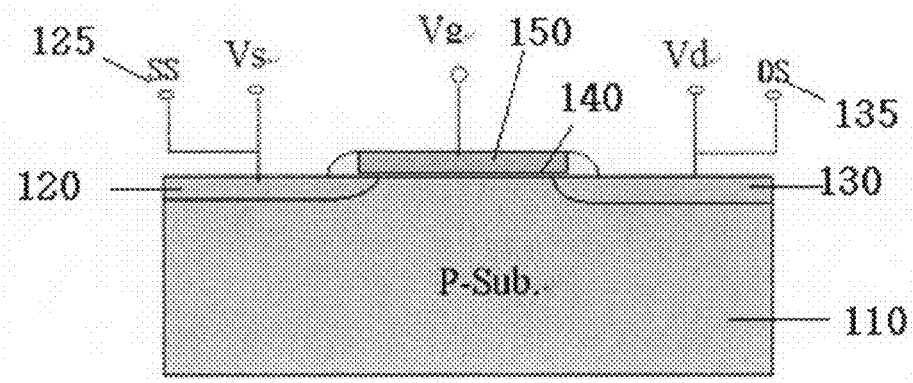
FIGS. 2 and 3 respectively illustrate a sectional view and a plan view of a semiconductor device according to a first embodiment, an analog channel resistance of which can be measured.
Figure 3:
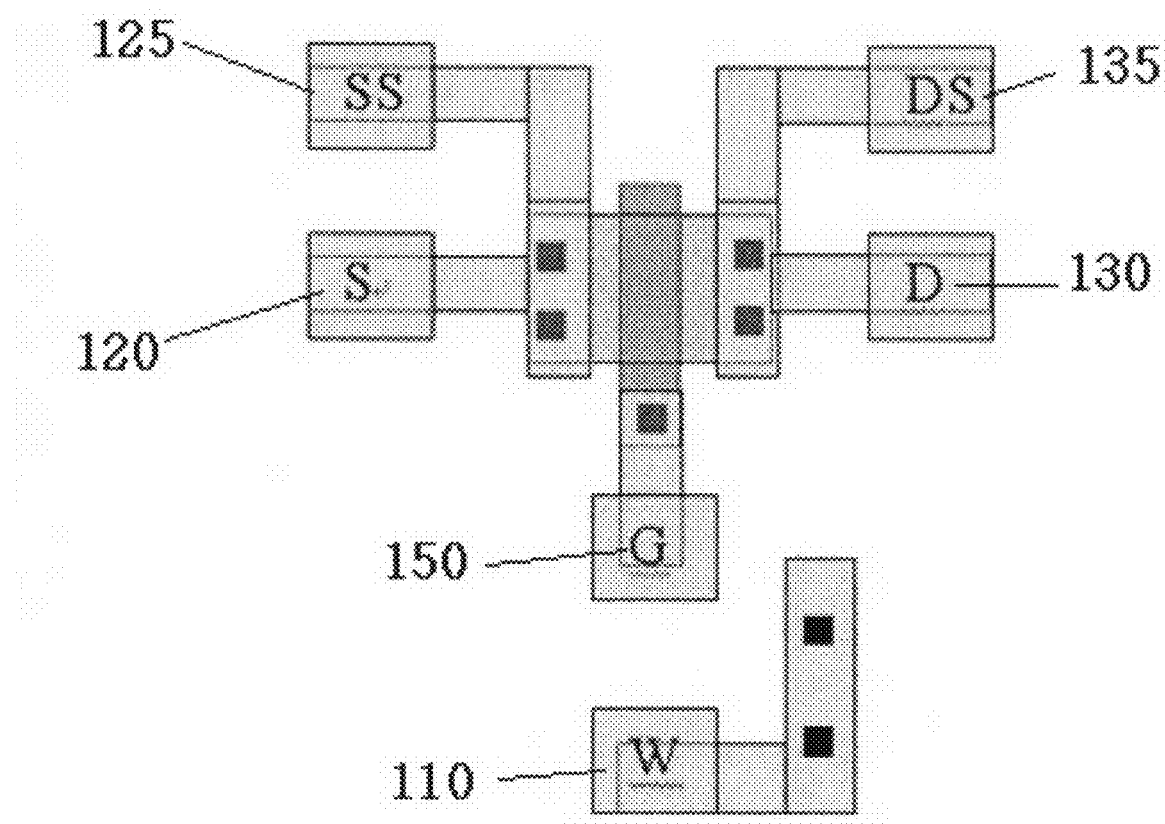

FIGS. 2 and 3 respectively illustrate a sectional view and a plan view of a semiconductor device according to a first embodiment, an analog channel resistance of which can be accurately measured.

The semiconductor device according to the first embodiment includes: a substrate 110; a gate insulating layer 140 and a gate 150 formed on gate insulating layer 140; a source 120 and a drain 130 provided in substrate 110 and at both sides of gate 150; a source sense (SS) 125 connected to source 120; and a drain sense (DS) 135 connected to drain 130.

Source sense 125 and drain sense 135 may be used for measuring an analog channel resistance of the semiconductor device. That is, in the semiconductor device, drain sense 135 and source sense 125, which can respectively measure voltages on drain 130 and source 120, are further provided on the existing measuring pattern.

Voltages are measured under the condition that a current flowing through drain sense 135 and source sense 125 is constrained to 0 Ampere. Thus, a voltage drop is 0 Volt according to Kirchhoff's voltage law, because the current is constrained to 0 Ampere. Hence, it can be understood that the measured voltages correspond to surface potentials of drain 130 and source 120.

Consequently, a difference between voltages measured at terminals of drain sense 135 and source sense 125 represents an approximate value to a potential difference between drain 130 and source 120 of the semiconductor device. Accordingly, the analog channel resistance of the semiconductor device can be accurately obtained using the measured current value. In this particular embodiment, the semiconductor device may include a MOS transistor.

Second Embodiment

A method for measuring an analog channel resistance of a semiconductor device according to a second embodiment will be described below. The method according to the second embodiment measures an analog channel resistance of a semiconductor device including substrate 110, gate 150, source 120, and drain 130.

First, a predetermined measuring condition including bias voltages is set, and then the bias voltages of the predetermined measuring condition are applied. Thereafter, a voltage is applied to drain 130 to measure a drain current, and a voltage of source sense 125 is measured under the condition that a current of source sense 125, which is connected to source 120, is constrained to 0 Ampere.

Thereafter, bias voltages of the predetermined measuring condition are applied, and a voltage is applied to drain 130, thereby measuring a drain current. Afterwards, under the condition that a current of drain sense 135, which is connected to drain 130, is constrained to 0 Ampere, a voltage of drain sense 135 is measured.

After that, a voltage drop between voltages of source 120 and drain 130 is accurately measured using a difference in voltages of source sense 125 and drain sense 135, so that the analog channel resistance is obtained.

That is, a difference between voltages measured at terminals of drain sense 135 and source sense 125 represents an approximate value to a potential difference between drain 130 and source 120 of the semiconductor device. Accordingly, the analog channel resistance of the semiconductor device can be accurately obtained using the measured current value.

Figure 4:
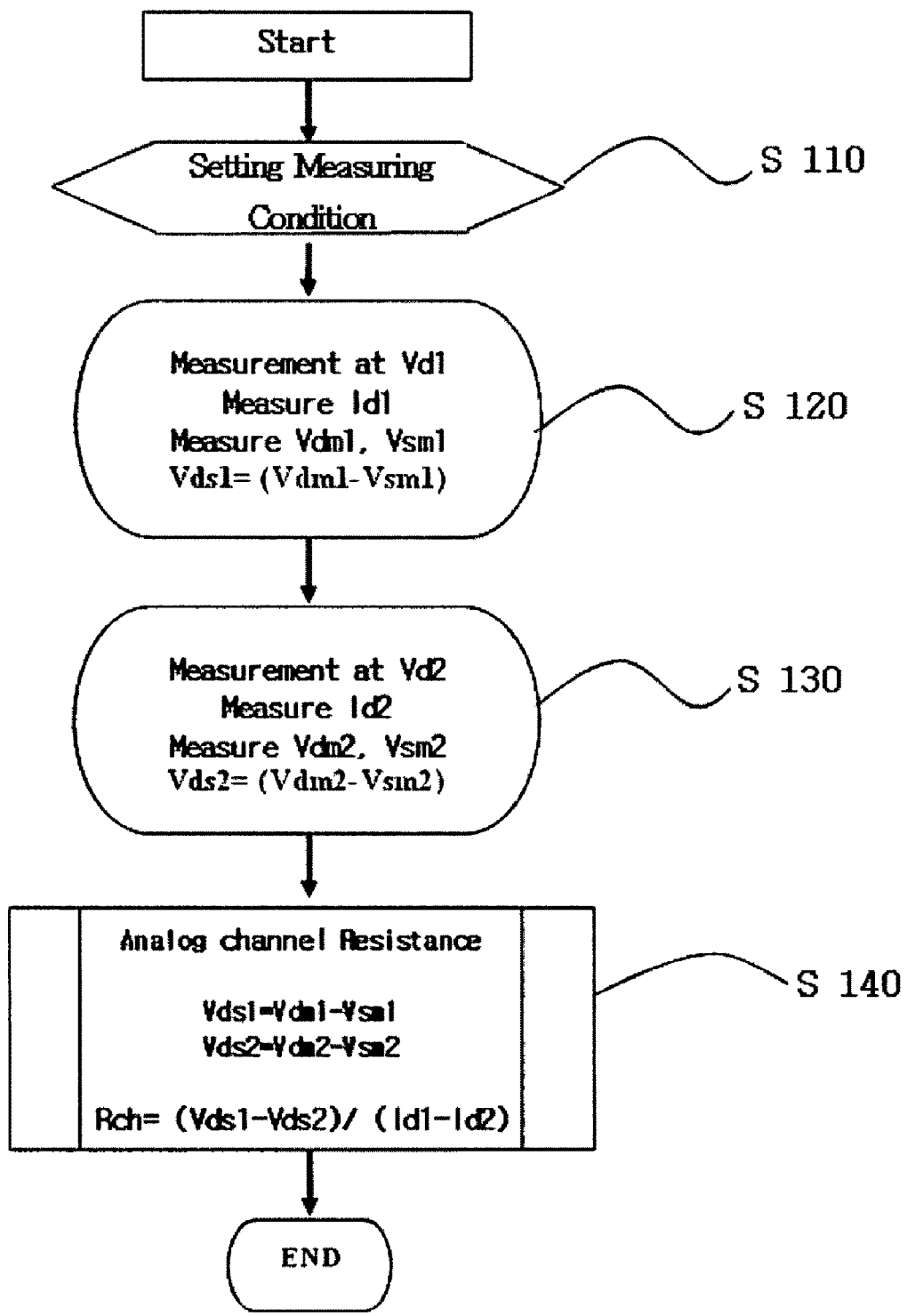
FIG. 4 is a flowchart illustrating a method for measuring an analog channel resistance according to a second embodiment.

Hereinafter, the method for measuring an analog channel resistance according to the second embodiment will be described in detail with reference to FIG. 4.

First, a predetermined measuring condition including bias voltages is set (S110). The measuring condition may include:
Gate voltage: Vg (Operation voltage),
Source voltage: Vs=0 Volt, and
Substrate (bulk) voltage: Vb=0 Volt.

Thereafter, after the bias voltages of the measuring conditions are applied, a drain voltage Vd1 is applied to drain 130 and a drain current is measured. The voltages of drain sense 135 and source sense 125 are measured (S120).

Specifically, after the bias voltages of the measuring condition are applied, drain voltage Vd1 is applied to drain 130, so that a drain current Id1 is measured. Under the condition that the current of drain sense 135 is constrained to 0 Ampere, a voltage of drain sense 135 is measured, which is set to Vdm1. Further, under the condition that the current of source sense 125 is constrained to 0 Ampere, a voltage of source sense 125 is measured, which is set to Vsm1. Accordingly, a voltage difference Vds1 can be obtained by subtracting voltage Vsm1 of source sense 125 from voltage Vdm1 of drain sense 135, i.e., Vds1=(Vdm1−Vsm1).

Afterwards, after the bias voltages of the above measuring conditions are applied, a drain voltage Vd2 is applied to drain 130 and a drain current is measured. The voltages of drain sense 135 and source sense 125 are then measured (S130). It is understood that drain voltages Vd1 and Vd2 may be different from each other, so as to measure the analog channel resistance.

Specifically, after the bias voltages of the measuring condition are applied, drain voltage Vd2 is applied to drain 130 and a drain current is measured, which is set to Id2. Under the condition that the current of drain sense 135 is constrained to 0 Ampere, a voltage of drain sense 135 is measured, which is set to Vdm2. Further, under the condition that the current of source sense 125 is constrained to 0 Ampere, a voltage of source sense 125 is measured, which is set to Vsm2.

Next, an analog channel resistance Rch is measured using the above measured data (S140).

First, voltage differences Vds1 and Vds2 are calculated from Vds1=(Vdm1−Vsm1) and Vds2=(Vdm2−Vsm2) by using the measured values of Vdm1, Vsm1, Vdm2, and Vsm2.

Thereafter, analog channel resistance Rch is calculated using the measured values of Vds1, Vds2, Id1, and Id2, i.e., Rch=(Vds1−Vds2)/(Id1−Id2). Here, when the semiconductor device is operated in a linear region, analog channel resistance Rch corresponds to a value obtained by differentiating a voltage variation (Vds1−Vds2) between drain 130 and source 120 over a current variation (Id1−Id2).

In FIG. 1, analog channel resistance Rch corresponds to a reciprocal of a slope of a tangent line 1, as described above. That is, according to the second embodiment, the voltages are measured under the condition that the current at drain sense 135 and source sense 125 is constrained to 0 Ampere. As a result, a voltage drop is 0 Volt according to Kirchhoff's voltage law, because the current is constrained to 0 Ampere.

Hence, it can be understood that the measured voltages correspond to surface potentials of drain 130 and source 120.

Consequently, a difference between voltages measured at terminals of drain sense 135 and source sense 125 represents an approximate value to a potential difference between drain 130 and source 120 of the transistor. Accordingly, the analog channel resistance of the transistor can be accurately obtained using the measured current value.

As described above, predetermined terminals, i.e., drain sense 135 and source sense 125, which can respectively measure voltages at drain 130 and source 120, are added to the existing measuring pattern, and voltages are measured under the condition that the current of drain sense 135 and source sense 125 are constrained to 0 Ampere. Thus, a voltage drop is 0 Volt according to Kirchhoff's voltage law, because the current is constrained to 0 Ampere. Hence, it can be understood that the measured voltages correspond to surface potentials of drain 130 and source 120.

Accordingly, a difference between voltages measured at terminals of drain sense 135 and source sense 125 represents an approximate value to a potential difference between drain 130 and source 120 of the semiconductor device. Therefore, the analog channel resistance of the transistor can be accurately obtained using the measured current value.

Although the present invention has been described with reference to a number of illustrative embodiments, it should be understood that numerous other modifications and embodiments can be devised by those skilled in the art without departing from the spirit and scope of the invention as claimed. More particularly, various variations and modifications are possible in the component parts and/or arrangements of the subject combination arrangement within the scope of the appended claims. In addition, alternative uses will also be apparent to those skilled in the art.

What is claimed is:

1. A method for measuring an analog channel resistance of a semiconductor device having a gate, a source, a source sense coupled to the source, a drain, and a drain sense coupled to the drain, the method comprising:
    setting a measuring condition including at least one bias voltage;
    measuring a first drain current by applying a first voltage to the drain after applying the at least one bias voltage of the measuring condition;
    measuring a first voltage difference of the drain sense and the source sense under the condition that currents of the source sense and the drain sense are constrained to zero Ampere;
    measuring a second drain current by applying a second voltage to the drain after applying the at least one bias voltage of the measuring condition;
    measuring a second voltage difference of the drain sense and the source sense under the condition that currents of the source sense and the drain sense are constrained to zero Ampere; and
    measuring the analog channel resistance by calculating a ratio of a voltage drop between the first and second voltage difference, and a current difference between the first and second drain currents.

2. The method according to claim 1, wherein the at least one bias voltage includes a gate voltage (Vg), which is an operation voltage, a source voltage (Vs), which is set to zero Volt, and a substrate (bulk) voltage (Vb), which is set to zero Volt.

3. The method according to claim 1, wherein measuring the first voltage difference comprises:
    applying the first voltage to the drain after applying the at least one bias voltage of the measuring condition;
    measuring a voltage (Vsm1) of the source sense and a voltage (Vdm1) of the drain sense under the condition that currents of the source sense and the drain sense are constrained to zero Ampere; and
    obtaining the first voltage difference by subtracting the voltage (Vsm1) of the source sense from the voltage (Vdm1) of the drain sense (Vdm1).

4. The method according to claim 1, wherein measuring the second voltage difference comprises:
    applying the second voltage to the drain after applying the voltages of the measuring condition;
    measuring a voltage (Vdm2) of the drain sense and a voltage (Vsm2) of the source sense under the condition that currents of the drain sense and the source sense are constrained to zero Ampere; and
    obtaining the second voltage difference by subtracting the voltage (Vsm2) of the source sense from the voltage (Vdm2) of the drain sense (Vdm1).

* * * * *